United States Patent
Fukagawa et al.

(10) Patent No.: US 9,310,695 B2
(45) Date of Patent: Apr. 12, 2016

(54) EXPOSURE APPARATUS, METHOD OF OBTAINING AMOUNT OF REGULATION OF OBJECT TO BE REGULATED, PROGRAM, AND METHOD OF MANUFACTURING ARTICLE

(71) Applicant: CANON KABUSHIKI KAISHA, Tokyo (JP)

(72) Inventors: Youzou Fukagawa, Utsunomiya (JP); Yoshimi Takano, Utsunomiya (JP); Satoshi Kubo, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 136 days.

(21) Appl. No.: 14/362,525

(22) PCT Filed: Jun. 25, 2013

(86) PCT No.: PCT/JP2013/067963
§ 371 (c)(1),
(2) Date: Jun. 3, 2014

(87) PCT Pub. No.: WO2014/013856
PCT Pub. Date: Jan. 23, 2014

(65) Prior Publication Data
US 2014/0313499 A1  Oct. 23, 2014

(30) Foreign Application Priority Data
Jul. 19, 2012 (JP) ................. 2012-160940

(51) Int. Cl.
*G03B 27/68* (2006.01)
*G03F 7/20* (2006.01)
(Continued)

(52) U.S. Cl.
CPC ............ *G03F 7/70191* (2013.01); *G02B 7/005* (2013.01); *G02B 27/0012* (2013.01); *G03F 7/70258* (2013.01)

(58) Field of Classification Search
CPC .............. G03F 7/70191; G03F 7/7025; G02B 27/0012; G02B 7/005
See application file for complete search history.

(56) References Cited

U.S. PATENT DOCUMENTS 6,961,115 B2 * 11/2005 Hamatani ............... G03F 7/706
355/52
7,075,651 B2 * 7/2006 Tsukakoshi ............ G02B 7/023
250/548

(Continued)

FOREIGN PATENT DOCUMENTS

JP  2002-367886 A  12/2002
JP  2005-268451 A  9/2005
(Continued)

OTHER PUBLICATIONS

International Search Report issued in PCT/JP2013/067963, dated Sep. 3, 2013.
(Continued)

*Primary Examiner* — Deoram Persaud
(74) *Attorney, Agent, or Firm* — Rossi, Kimms & McDowell LLP

(57) ABSTRACT

The present invention provides an exposure apparatus including a projection device including an object whose at least one of a position, an attitude and a shape is regulatable, and configured to project light from a reticle onto a substrate, a regulating device configured to regulate the at least one of the position, the attitude and the shape of the object, and a controller configured to obtain, an amount of regulation of the object by the regulating device, the amount of regulation being used for regulating a first optical characteristic value of the projection device expressed by a square root of a weighted square sum of wavefront aberration coefficients of light projected by the projection device, and to control the regulating device based on the amount of regulation.

7 Claims, 7 Drawing Sheets

(51) Int. Cl.
*G02B 7/00* (2006.01)
*G02B 27/00* (2006.01)

(56) References Cited

U.S. PATENT DOCUMENTS

| | | | |
|---|---|---|---|
| 7,230,692 B2 | 6/2007 | Fukagawa et al. | |
| 8,102,503 B2 | 1/2012 | Yoshihara et al. | |
| 8,634,061 B2 | 1/2014 | Shigenobu et al. | |
| 2002/0001071 A1* | 1/2002 | Nomura | G03F 7/70258 355/52 |
| 2002/0163738 A1* | 11/2002 | Yoshihara | G02B 5/3083 359/711 |
| 2003/0047694 A1* | 3/2003 | Van Der Laan | G03F 7/706 250/548 |
| 2003/0172365 A1* | 9/2003 | Fukagawa | G03F 7/70433 716/55 |
| 2004/0119956 A1* | 6/2004 | Fukagawa | G03F 7/70616 355/52 |
| 2004/0174506 A1* | 9/2004 | Smith | G03F 7/706 355/53 |
| 2005/0036124 A1* | 2/2005 | Fukagawa | G03F 7/70358 355/53 |
| 2005/0179886 A1* | 8/2005 | Shi | G03F 1/144 355/77 |
| 2005/0185159 A1* | 8/2005 | Rosenbluth | G03F 7/705 355/53 |
| 2005/0206880 A1* | 9/2005 | Fukugawa | G03F 7/70258 356/124 |
| 2005/0253215 A1* | 11/2005 | Fukagawa | G06F 17/5072 257/467 |
| 2007/0064211 A1* | 3/2007 | Hatai | G03F 7/70633 355/55 |
| 2007/0268472 A1* | 11/2007 | Miyashiro | G03B 27/42 355/53 |
| 2010/0128367 A1* | 5/2010 | Beckenbach | G02B 7/023 359/820 |
| 2010/0157266 A1* | 6/2010 | Zimmermann | G03F 9/7026 355/53 |
| 2010/0195070 A1* | 8/2010 | Loering | G03F 1/62 355/52 |
| 2011/0181855 A1* | 7/2011 | Bittner | G03F 7/70266 355/55 |
| 2011/0205514 A1* | 8/2011 | Kita | G03F 7/70941 355/67 |
| 2012/0052448 A1* | 3/2012 | Gyoda | G03F 7/705 430/322 |
| 2013/0010306 A1* | 1/2013 | Coene | G01B 15/04 356/508 |
| 2015/0186581 A1* | 7/2015 | Chen | G06F 17/5068 716/54 |
| 2015/0227654 A1* | 8/2015 | Hunsche | G06F 17/5009 716/54 |

FOREIGN PATENT DOCUMENTS

| | | |
|---|---|---|
| JP | 2007-157824 A | 6/2007 |
| JP | 2009-105097 A | 5/2009 |
| JP | 2010-278034 A | 12/2010 |
| JP | 2011-009575 A | 1/2011 |

OTHER PUBLICATIONS

Written Opinion issued in PCT/JP2013/067963, dated Sep. 3, 2013.

* cited by examiner

US 9,310,695 B2

EXPOSURE APPARATUS, METHOD OF OBTAINING AMOUNT OF REGULATION OF OBJECT TO BE REGULATED, PROGRAM, AND METHOD OF MANUFACTURING ARTICLE

This application is a U.S. National Phase Application of PCT International Application PCT/JP2013/067963 filed Jun. 25, 2013 which is based on and claims priority from JP 2012-160940 filed Jul. 19, 2012 the contents of which is incorporated in its entirety by reference.

TECHNICAL FIELD

The present invention relates to an exposure apparatus, a method of obtaining an amount of regulation of an object to be regulated, a program, and a method of manufacturing an article.

BACKGROUND ART

An exposure apparatus which projects and transfers the pattern of a reticle (mask) onto a substrate by a projection optical system is employed to manufacture a semiconductor device using the photolithography technique. The projection optical system is regulated upon a step of measuring the optical characteristic (aberration), a step of calculating the amount of regulation of a regulating unit for correcting the optical characteristic based on the measured optical characteristic, and a step of regulating the regulating unit based on the calculated amount of regulation.

Also, the optical characteristic to be regulated depend on the amount of regulation of each unit (for example, lenses which constitute the projection optical system), and the maximum value of their absolute value is required to minimize at each point in the image plane (exposure region). Hence, Japanese Patent Laid-Open No. 2005-268451 proposes a technique of determining (optimizing) the amount of regulation of each unit using linear programming or quadratic programming.

Japanese Patent Laid-Open No. 2005-268451 discloses two methods for determining the amount of regulation of each unit, both of which pose the following problems. For example, the first method uses quadratic programming. With this method, the amount of regulation which minimizes the quadratic optical characteristic (for example, the (weighted) square sum of wavefront aberrations) can be obtained. However, this method uses the quadratic optical characteristic as an objective function, and therefore does not guarantee a precise optimum solution. Also, in the second method, an amount (for example, the square root of the (weighted) square sum of wavefront aberrations) corresponding to the RMS of the wavefront aberration is approximated by a linear expression which describes it as the weighted sum of the absolute values of wavefront aberration coefficients (Zernike coefficients), and a variable indicating the upper limit value of the linear expression is defined as an objective function. The amount of regulation which minimizes the value of the objective function is then solved by linear programming. This method can obtain a precise optimum solution, but may pose a problem resulting from an error of the above-mentioned approximation operation. Note that the RMS is an abbreviation for "Root Mean Square."

SUMMARY OF INVENTION

The present invention provides, for example, a technique advantageous in obtaining an amount of regulation of an object included in a projection device of an exposure apparatus.

According to one aspect of the present invention, there is provided an exposure apparatus which exposes a substrate to light through a reticle, the apparatus including a projection device including an object whose at least one of a position, an attitude and a shape is regulatable, and configured to project light from the reticle onto the substrate, a regulating device configured to regulate the at least one of the position, the attitude and the shape of the object, and a controller configured to obtain an amount of regulation of the object by the regulating device, the amount of regulation being used for regulating a first optical characteristic value of the projection device expressed by a square root of a weighted square sum of wavefront aberration coefficients of light projected by the projection device, and to control the regulating device based on the amount of regulation, wherein the controller is configured, under a constraint including a linear equality and a plurality of linear inequalities, the linear equality being linear with respect to the amount of regulation and indicating the wavefront aberration coefficient, and each of the plurality of linear inequalities being linear with respect to the wavefront aberration coefficient and indicating that, in an orthogonal coordinate system having each coordinate axis that represents the wavefront aberration coefficient, a distance to one of each side and each face of corresponding one of a polygon and a polyhedron, with a center of gravity thereof at an origin of the orthogonal coordinate system, from the origin is not greater than a first variable, to obtain, by linear programming, the amount of regulation which minimizes an objective function, wherein the objective function is the first variable.

Further features of the present invention will become apparent from the following description of exemplary embodiments with reference to the attached drawings.

DESCRIPTION OF EMBODIMENTS

Figure 1:
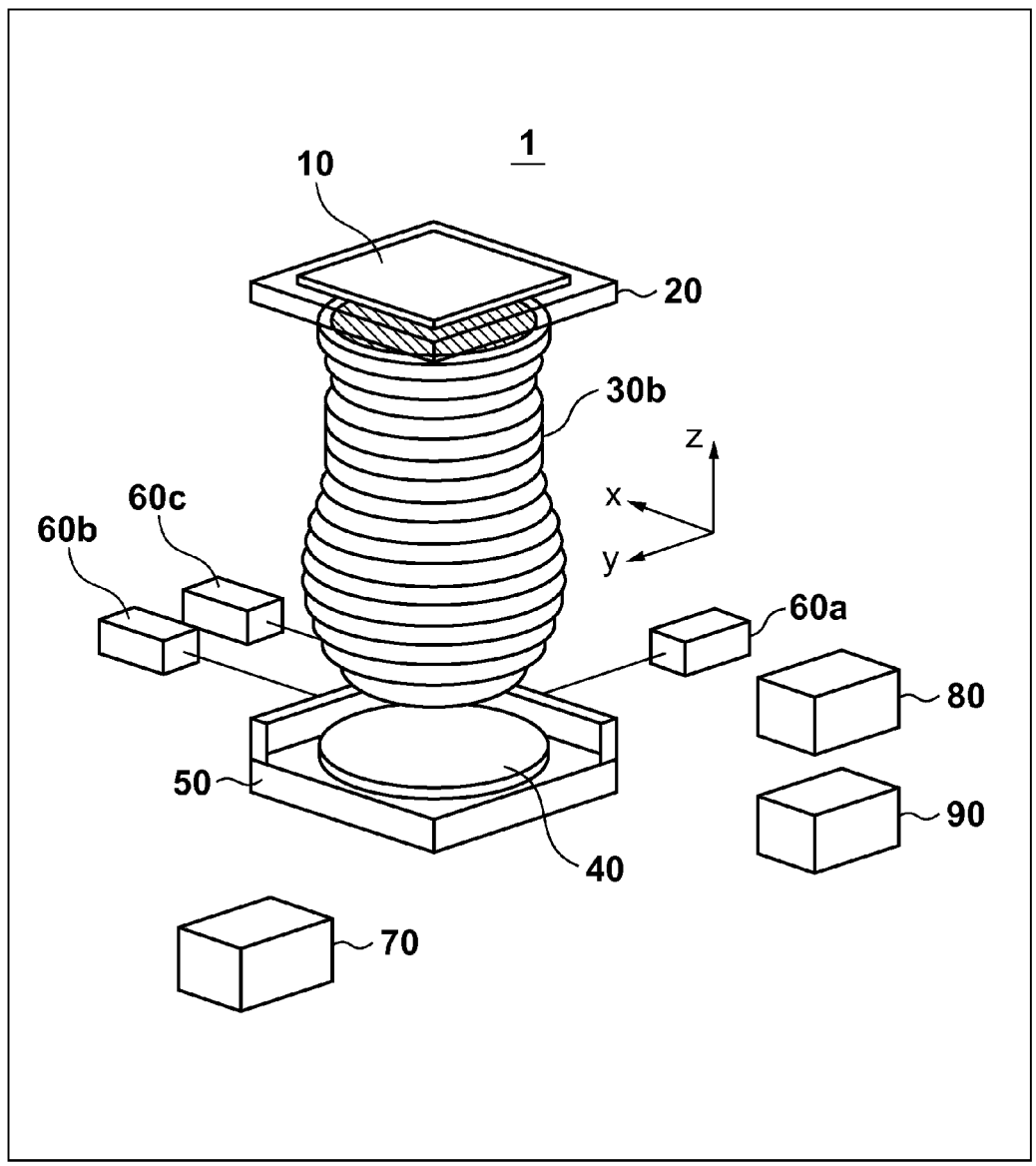
FIG. 1 is a schematic perspective view showing the configuration of an exposure apparatus according to an aspect of the present invention.

Preferred embodiments of the present invention will be described below with reference to the accompanying drawings. Note that the same reference numerals denote the same members throughout the drawings, and a repetitive description thereof will not be given.

<First Embodiment>

FIG. 1 is a schematic perspective view showing the configuration of an exposure apparatus 1 according to an aspect of the present invention. The exposure apparatus 1 exposes a substrate to light through a reticle (mask). More specifically, the exposure apparatus 1 exposes a substrate to light through a reticle using, for example, the step-and-scan scheme. However, the exposure apparatus 1 may adopt the step-and-repeat scheme or another exposure scheme.

The exposure apparatus 1 includes an illumination optical system (not shown), a reticle stage 20 which holds a reticle 10, a projection optical system 30, a substrate stage 50 which holds a substrate 40, laser interferometers 60a, 60b, and 60c, a measuring unit 70, a regulating unit 80, and a control unit 90.

The illumination optical system illuminates the reticle 10 with light from a light source such as a KrF excimer laser having a wavelength of about 248 nm, an ArF excimer laser having a wavelength of about 193 nm, or an $F_2$ laser having a wavelength of about 157 nm.

The reticle 10 has a pattern (circuit pattern) to be transferred onto the substrate 40, and is held by the reticle stage 20. Light (diffracted light) diffracted by the pattern of the reticle 10 is projected onto the substrate 40 through the projection optical system 30.

The reticle stage 20 includes, for example, a reticle chuck, and is moved by the regulating unit 80 upon holding the reticle 10. The regulating unit 80 is controlled by the control unit 90, and has a function of regulating at least one of the position and attitude of the reticle 10.

The projection optical system 30 includes a plurality of optical elements (for example, a lens, mirror, and aperture stop), and projects light from the reticle 10 onto the substrate 40. Each of some of the plurality of optical elements included in the projection optical system 30 has a position, attitude, and shape, at least one of which can be regulated by the regulating unit 80. The regulation of these optical elements by the regulating unit 80 is also controlled by the control unit 90. The regulating unit 80 regulates at least one of the position, attitude, and shape of each of some of the plurality of optical elements included in the projection optical system 30. The regulating unit 80 can include, for example, a mechanism which displaces the optical elements in the optical axis direction (the Z-direction shown in FIG. 1) or a direction perpendicular to the optical axis direction, a mechanism which tilts the optical elements with respect to the optical axis, and a mechanism which deforms the optical elements.

The substrate 40 is a substrate onto which the pattern of the reticle 10 is transferred. The substrate 40 is coated with a resist (photosensitive agent). The substrate 40 includes, for example, a silicon wafer, glass plate, and other substrates.

The substrate stage 50 includes, for example, a substrate chuck, and is moved by the regulating unit 80 upon holding the substrate 40. The regulating unit 80 is controlled by the control unit 90, and has a function of regulating at least one of the position and attitude of the substrate 40.

Note that the reticle stage 20, projection optical system 30, and substrate stage 50 constitute a projection unit in the exposure apparatus 1.

The laser interferometers 60a, 60b, and 60c are arranged around the substrate stage 50, and measure the position of the substrate stage 50.

The measuring unit 70 measures the optical characteristic in the exposure apparatus 1 and, especially, those of the projection optical system 30. The measuring unit 70 includes, for example, an interferometer, and has a function of measuring a wavefront aberration at each point (at each of a plurality of image heights) in the image plane (exposure region) of the projection optical system 30. The measuring unit 70 may also have a function of measuring a distortion as the aberration of the projection optical system 30. The distortion indicates the amount of deviation of the position of an actual image on the image plane from that of an ideal image, and can be measured at each point on the image plane (in the exposure region). Since the measuring unit 70 can take any form known to those skilled in the art, its structure and operation will not be described in detail herein.

The control unit 90 includes, for example, a CPU and memory, and can control the operation of each unit of the exposure apparatus 1. The control unit 90 can control, for example, the scan operations of the reticle stage 20 and substrate stage 50. Also, in this embodiment, the control unit 90 obtains (calculates) the amount of regulation of at least one of each optical element of the projection optical system 30, the reticle stage 20, and the substrate stage 50 by the regulating unit 80, using linear programming based on the measurement result obtained by the measuring unit 70. The control unit 90 controls the regulating unit 80 based on the amount of regulation obtained using linear programming. A method of obtaining the amount of regulation by the control unit 90 will be described in detail later.

Figure 2:
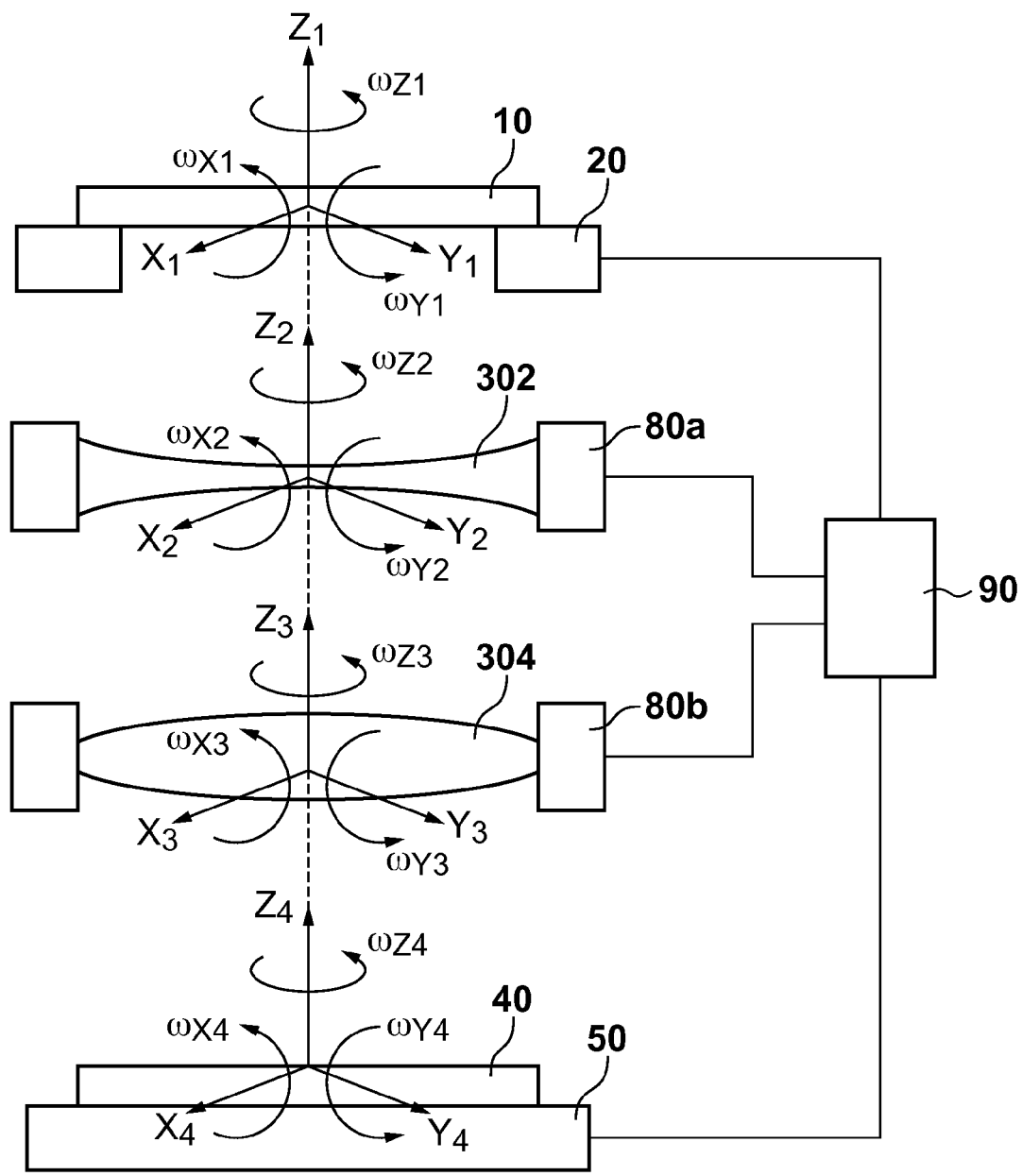
FIG. 2 is a view schematically illustrating an example of the direction (driving direction) in which a reticle, and optical elements included in a projection optical system, both of which have regulable positions, are movable in the exposure apparatus shown in FIG. 1.

FIG. 2 is a view schematically illustrating an example of the direction (driving direction) in which the reticle 10, optical elements 302 and 304 included in the projection optical system 30, and the substrate 40 are movable. The position of the reticle 10 is regulated in six degrees of freedom (that is, degrees of freedom indicated by arrows $x_1$, $y_1$, $z_1$, $\omega_{x1}$, $\omega_{y1}$, and $\omega_{z1}$) through the regulating unit 80 and reticle stage 20. The position of the optical element 302 is similarly regulated, in six degrees of freedom (that is, degrees of freedom indicated by arrows $x_2$, $y_2$, $z_2$, $\omega_{x2}$, $\omega_{y2}$, and $\omega_{z2}$) through the regulating unit 80. The position of the optical element 304 is similarly regulated in six degrees of freedom (that is, degrees of freedom indicated by arrows $x_3$, $y_3$, $z_3$, $\omega_{x3}$, $\omega_{y3}$, and $\omega_{z3}$) through the regulating unit 80. The position of the substrate 40 is similarly regulated in six degrees of freedom (that is, degrees of freedom indicated by arrows $x_4$, $y_4$, $z_4$, $\omega_{x4}$, $\omega_{y4}$, and $\omega_{z4}$) through the regulating unit 80 and substrate stage 50.

Figure 3:
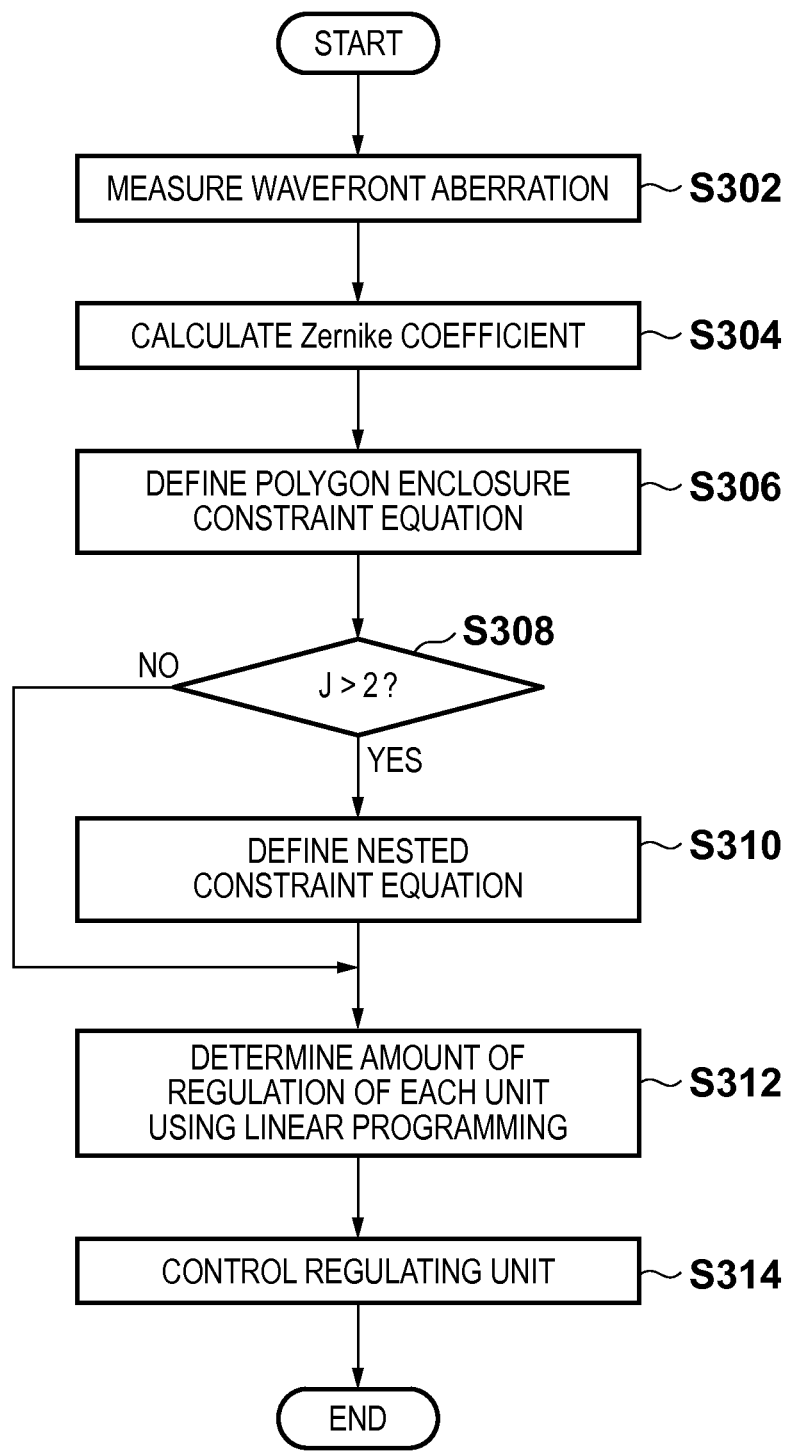
FIG. 3 is a flowchart for explaining how to regulate the projection optical system in the exposure apparatus shown in FIG. 1.

A method of regulating the optical characteristic (also called the aberration) in the exposure apparatus (projection optical system 30) will be described below. FIG. 3 is a flowchart for explaining how to regulate the optical characteristic in the exposure apparatus 1. The optical characteristic can be regulated by making the control unit 90 execute overall control of each unit of the exposure apparatus 1, as described above.

In step S302, the aberration (wavefront aberration) of the projection optical system 30 is measured through the measuring unit 70. More specifically, the wavefront aberration is measured for each of H measurement points (image heights) in the image plane (exposure region) of the projection optical system 30.

In step S304, the control unit 90 expands the wavefront aberration at an image height h, which is measured in step S302, using J (first to Jth) Zernike orthogonal functions to calculate each Zernike coefficient $z_{jh}$. An optical characteristic value represented by a linear expression for a Zernike coefficient, which is exemplified by, for example, line width asymmetry, curvature of field, and astigmatism, can be obtained from the Zernike coefficient $z_{jh}$. The Zernike coefficient, that is, the optical characteristic value can be represented by a linear function describing the amount of regulation of each object to be regulated (the reticle stage 20, substrate stage 50, and optical elements 302 and 304). Accordingly, in this embodiment, the optical characteristic value will be referred to as a linear optical characteristic value (second optical characteristic value) hereinafter. Also, an optical characteristic value (an optical characteristic value corresponding to the RMS of the wavefront aberration) expressed as the square root of the (weighted) square sum of the Zernike coefficients $z_{jh}$ can be obtained from the Zernike coefficients $z_{jh}$. The square of the optical characteristic value can be represented by a quadratic function describing the amount of regulation of each object to be regulated (the reticle stage 20, substrate stage 50, and optical elements 302 and 304). Accordingly, in this embodiment, the optical characteristic value will also be referred to as a quadratic optical characteristic value (first optical characteristic value) hereinafter.

Note that the subscripts h, i, j, and k used in the following description are defined by:

$$h = 1, \ldots, H \quad (1)$$

$$i = 1, \ldots, I \quad (2)$$

$$j = 1, \ldots, J \quad (3)$$

$$k = 1, \ldots, K \quad (4)$$

The Zernike coefficient $z_{jh}$ after the amount of regulation of each unit is changed is given by:

$$z_{jh} = z_{0jh} + \sum_{k=1}^{K} b_{jhk} x_k \quad (5)$$

where $z_{0jh}$ is the initial value (measurement value) of the jth Zernike coefficient at the image height h, $x_k$ is the kth amount of regulation of each object to be regulated, and $b_{jhk}$ is the degree of influence $b_{jhk}$ of the amount of regulation $x_k$ of each object to be regulated (the amount of change in Zernike coefficient $z_{jh}$ per unit amount of $x_k$).

On the other hand, a wavefront aberration $rms_h$ at each image height h is given by:

$$rms_h = \sqrt{\sum_{j=1}^{J} \alpha_{jh} z_{jh}^2} \quad (6)$$

where $\alpha_{jh}$ is a coefficient (positive value) by which the Zernike coefficient $z_{jh}$ is to be multiplied. Note that the wavefront aberration $rms_h$ is the square root of the weighted square sum of the Zernike coefficients $z_{jh}$. In this case, all the weighting coefficients $\alpha_{jh}$ may be 1.

Assuming herein that $\beta_{jh}^2 = \alpha_{jh} z_{jh}^2$, relation (6) is rewritten as:

$$rms_h = \sqrt{\sum_{j=1}^{J} \beta_{jh}^2} \quad (7)$$

If a first dummy variable (to be also simply referred to as a first variable hereinafter) indicating the upper limit value of the wavefront aberration $rms_h$ is defined as $t_{2h}$ for J=2, relation (7) is rewritten as:

$$t_{2h} \geq rms_h = \sqrt{\beta_{1h}^2 + \beta_{2h}^2} \quad (8)$$

Note that in place of relation (8), inequalities presented in relations (9) to (12) are defined using the first dummy variable $t_{2h}$ as per:

$$t_{2h} \geq \frac{a_m}{b_m}\beta_{1h} + \frac{1}{b_m}\beta_{2h} \quad (9)$$

$$t_{2h} \geq \frac{1}{b_m}\beta_{1h} + \frac{a_m}{b_m}\beta_{2h} \quad (10)$$

$$t_{2h} \geq -\frac{1}{b_m}\beta_{1h} - \frac{a_m}{b_m}\beta_{2h} \quad (11)$$

$$t_{2h} \geq \frac{a_m}{b_m}\beta_{1h} - \frac{1}{b_m}\beta_{2h} \quad (12)$$

for $$b_m = \sqrt{a_m^2 + 1},$$
$$a_m = \tan(\theta_m),$$
$$0 \leq \theta_m < \frac{\pi}{2}$$

Figure 4:
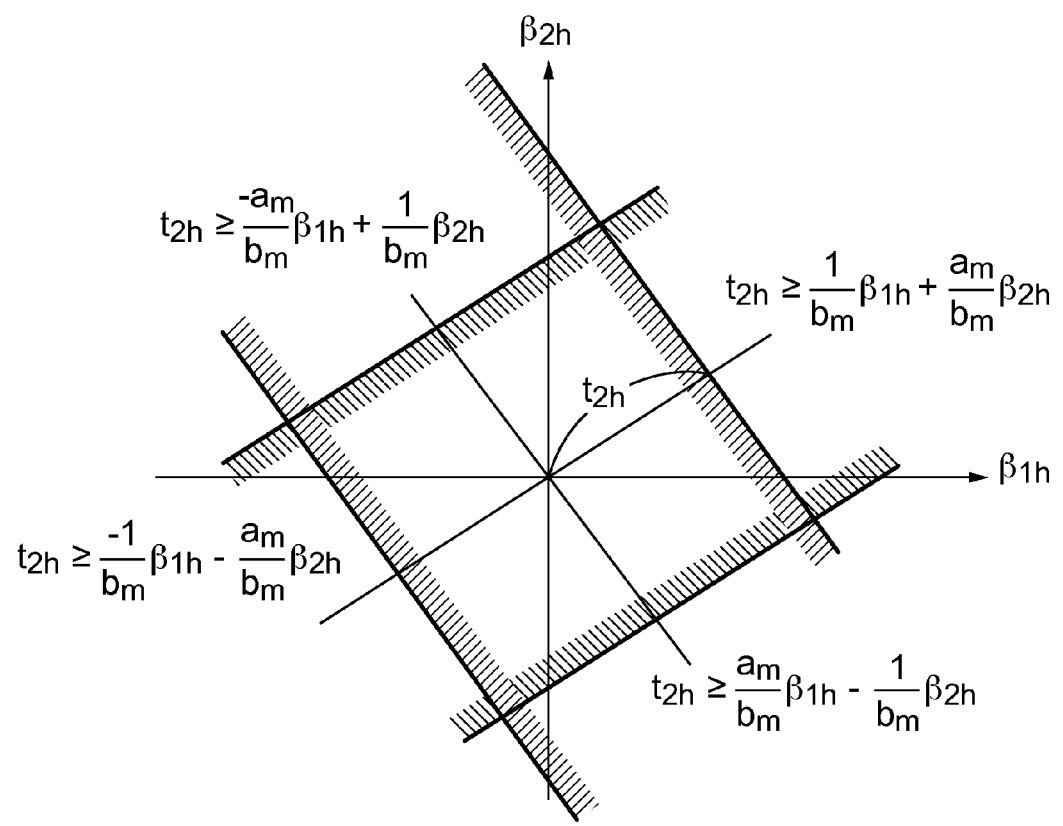
FIG. 4 is a view showing the ranges of $\beta_{1h}$ and $\beta_{2h}$ which satisfy inequalities presented in relations (9) to (12).
Figure 5:
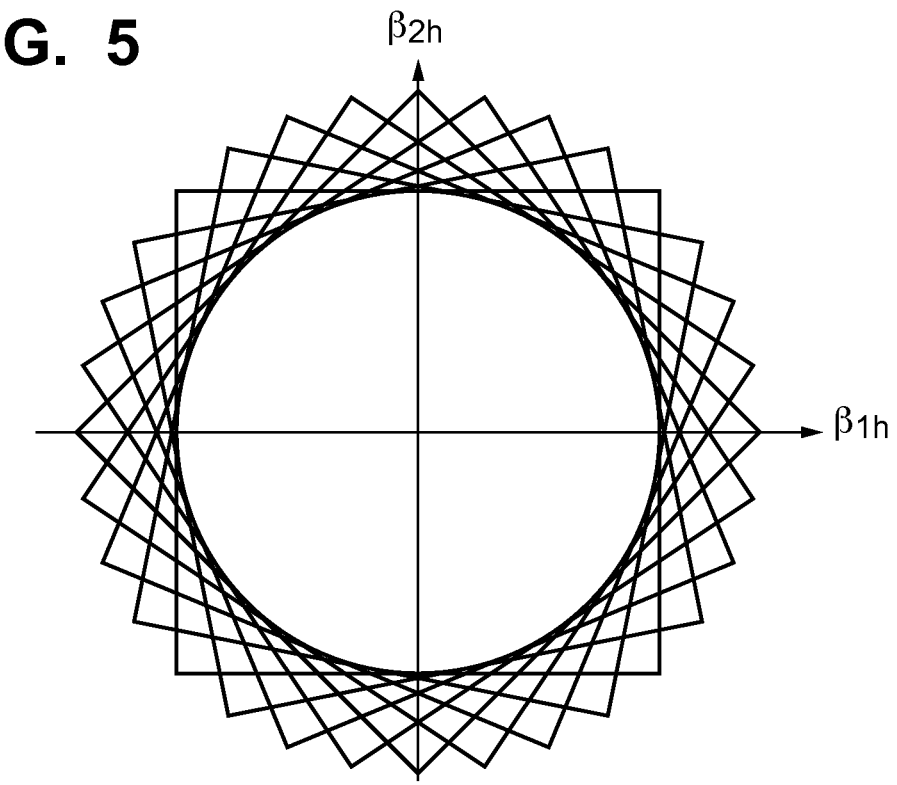
FIG. 5 is a view showing the ranges of $\beta_{1h}$ and $\beta_{2h}$ which satisfy a plurality of inequalities including relations (9) to (12).

FIG. 4 shows the ranges of $\beta_{1h}$ and $\beta_{2h}$ which satisfy inequalities presented in relations (9) to (12). Also, when a plurality of values are set for $\theta_m$ ($0 \leq \theta_m < (\pi/2)$) to increase the number of inequalities, the shape defined by the ranges of $\beta_{1h}$ and $\beta_{2h}$ which satisfy these inequalities comes close to a circle, as shown in FIG. 5. Note that $t_{2h}$ in relations (9) to (12) is the distance from the origin to each side of a polygon (the length of a normal dropped from the origin to each side) in orthogonal coordinate systems shown in FIGS. 4 and 5. In other words, satisfying inequalities presented in relations (9) to (12) approximates (that is, approximately represents) satisfying relation (8). Inequalities (constraint expressions) as presented in relations (9) to (12) will be referred to as polygon enclosure constraint expressions hereinafter.

Therefore, when polygon enclosure constraint expressions presented in relations (5) to (12) are used as constraints, and the first dummy variable $t_{2h}$ is used as an objective function, the amount of regulation $x_k$ which minimizes the objective function can be obtained using linear programming. In other words, the amount of regulation of each object to be regulated, which minimizes the wavefront aberration $rms_h$, can be obtained by linear programming.

Figure 6:
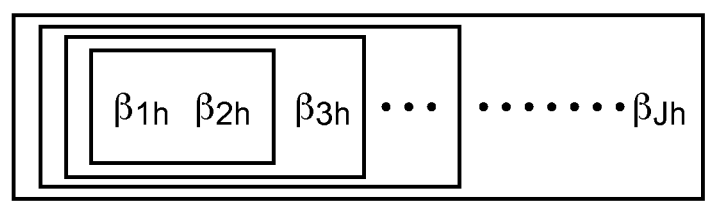
FIG. 6 is a view illustrating an example (ladder tournament scheme) of the structure of a constraint expression (nested constraint expression) defined by two variables.
Figure 7:
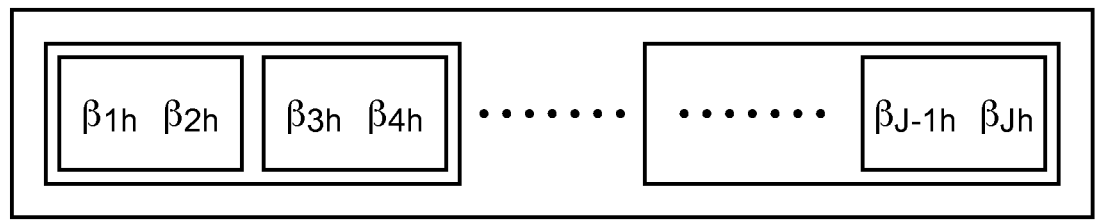
FIG. 7 is a view illustrating an example (knockout tournament scheme) of the structure of a constraint expression (nested constraint expression) defined by two variables.

If the number J of $\beta_{jh}$ as a variable is larger than 2 (J>2), it is only necessary to prepare (J−1) dummy variables $t_{2h}$ to $t_{jh}$, and add inequalities given by:

$$t_{3h} \geq \sqrt{t_{2h}^2 + \beta_{3h}^2} \quad (13)$$

$$t_{4h} \geq \sqrt{t_{3h}^2 + \beta_{4h}^2} \quad (14)$$

$$\vdots$$

$$t_{jh} \geq \sqrt{t_{(J-1)h}^2 + \beta_{jh}^2} \quad (15)$$

to constraints. Thus, a constraint expression which includes the upper limit value of a preceding constraint expression and is always defined by two variables will be referred to as a nested constraint expression (or nested constraint expression) hereinafter. The nested constraint expression may adopt either a ladder tournament structure as shown in FIG. 6 or a knockout tournament structure as shown in FIG. 7.

To minimize the maximum value of the wavefront aberration $rms_h$ at a given image height h, constraints including polygon enclosure constraint expressions corresponding to relations (8) and (13) to (15) need only be defined to solve a linear programming problem represented by an objective function as:

$$\text{Minimization: } f = t_{Jh} \tag{16}$$

A first dummy variable (a dummy variable serving as an objective function) is defined as $t_{2h}$ for J=2, while a first dummy variable is defined as $t_{jh}$, and second dummy variables are defined as $t_{2h}, t_{3h}, \ldots, t_{(j-1)h}$ for J =2. The second dummy variables will also simply be referred to as second variables hereinafter.

Referring back to FIG. 3 in consideration of the foregoing, in step S306, polygon enclosure constraint expressions (for example, relations (9) to (12)) are determined (defined) using the dummy variable $t_{2h}$ which defines the upper limit of the wavefront aberration $rms_h$. In other words, a constraint expression, indicating that the wavefront aberration $rms_h$ is on or falls within the outline of a polygon including the origin of an orthogonal coordinate system having a wavefront aberration coefficient as a coordinate axis (for example, a polygon having its center of gravity at the origin) is determined. Note that a plurality of sides of the polygon are represented by linear expressions (see FIGS. 4 and 5). More generally, polygon enclosure constraint expressions can be a plurality of linear inequalities for a wavefront aberration coefficient indicating that the distance from the origin to each side or each face of a polygon or polyhedron having its center of gravity at the origin of an orthogonal coordinate system having a wavefront aberration coefficient on each coordinate axis is equal to or smaller than a first variable.

In step S305, it is determined whether the number J of $\beta_{jh}$ serving as a variable is larger than 2 (J>2). If the number J of $\beta_{jh}$ is larger than 2, the process proceeds to step S310. However, if the number J of $\beta_{jh}$ is equal to or smaller than 2, the process proceeds to step S312.

In step S310, nested constraint expressions (for example, relations (13) to (15)) are determined (defined) as constraints. The wavefront aberration $rms_h$ corresponding to the quadratic optical characteristic value is expressed as the square root of the square sum of J (J>2) Zernike coefficients. It is therefore necessary to obtain the amount of regulation of an object to be regulated, using an inequality indicating that the value of the square root of the sum of the square of the upper limit value of the square sum of (J−1) Zernike coefficients, and the square of the Jth Zernike coefficient is equal to or larger than that of a new dummy variable.

In step S312, the amount of regulation of each object to be regulated (each unit) is obtained (determined) using linear programming, as described above. More specifically, assuming a first dummy variable $t_{Jh}$ as an objective function, the amount of regulation of each object to be regulated, which minimizes the value of the dummy function $t_{Jh}$, is obtained using linear programming.

In step S314, the regulating unit 80 is controlled based on the amount of regulation obtained in step S312. More specifically, the regulating unit 80 drives each object to be regulated in accordance with the amount of regulation obtained in step S312 to regulate the optical characteristic (quadratic optical characteristic value) of the exposure apparatus.

With this arrangement, in this embodiment, an amount indicating that the quadratic optical characteristic value of the exposure apparatus is equal to or smaller than the upper limit value is approximated by a plurality of linear inequalities to obtain the amount of regulation of each object to be regulated, which is used to regulate the quadratic optical characteristic value. Upon such approximation, a linear programming algorithm capable of obtaining a solution at high speed even for a large-scale problem can be used for a minimization problem of the maximum value of the wavefront aberration. Also, since the linear optical characteristic value of the exposure apparatus can be simultaneously optimized, complex regulation of the optical characteristic of the exposure apparatus can be done with high accuracy in a short period of time, as will be described later.

In the exposure apparatus, a light beam emitted by a light source illuminates the reticle 10 by an illumination optical system. The light which bears the information of the pattern of the reticle 10 forms an image on the substrate 40 by the projection optical system 30. At this time, the optical characteristic of the exposure apparatus can be regulated using the above-mentioned regulating method to attain excellent imaging performance. Hence, the exposure apparatus 1 is advantageous in terms of at least one of the resolution, overlay accuracy, and throughput.

<Second Embodiment>

Figure 8:
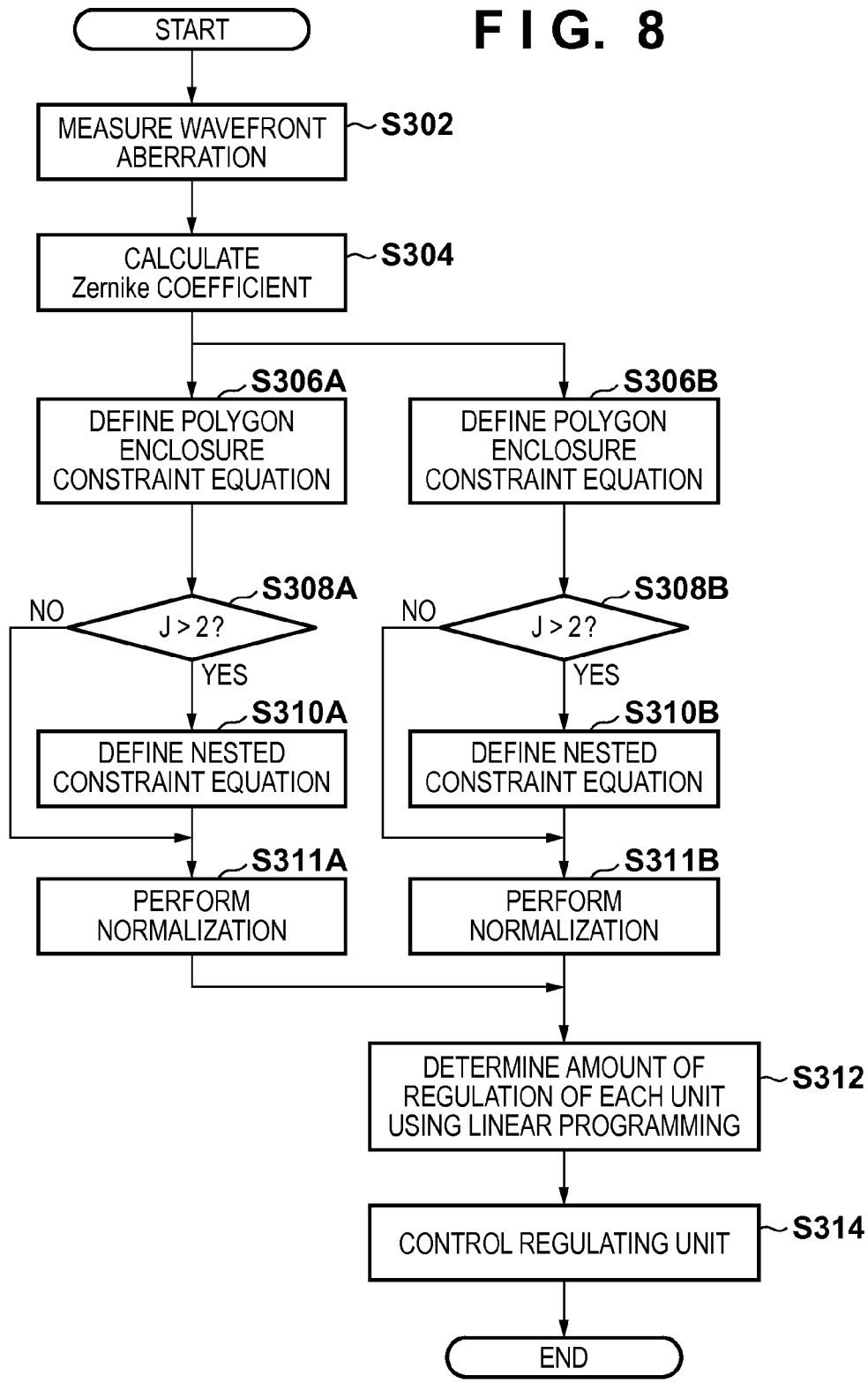
FIG. 8 is a flowchart for explaining how to regulate the projection optical system in the exposure apparatus shown in FIG. 1.

The case wherein a plurality of image heights h (H portions) are present in the image plane of a projection optical system 30 will be described in this embodiment. In this case, to minimize a wavefront aberration $rms_h$ with good balance in accordance with an allowable value determined for each image height (each portion), as shown in FIG. 8, an upper limit value t of a value (normalized value) obtained by dividing an upper limit value $t_{Jh}$ at each image height by its allowable value $w_h$ need only be defined as:

$$t \geq \frac{1}{w_h} t_{Jh}, \tag{17}$$

$$h = 1, \ldots, H$$

where $w_h$ is the allowable value (positive value) of the wavefront aberration $rms_h$ at each image height.

Then, polygon enclosure constraint expressions corresponding to relations (8) and (13) to (15), and a constraint including relation (17) are determined. A solution which minimizes the wavefront aberration $rms_h$ with good balance can be obtained for ail image heights by solving a linear programming problem represented by an objective function as:

$$\text{Minimization: } f = t \tag{18}$$

Therefore, referring to FIG. 6, in step S306A, a polygon enclosure constraint expression is determined (defined) using a dummy variable (to be also referred to as a third dummy variable or simply as a third variable hereinafter) indicating the upper limit of a wavefront aberration $rms_1$ at a first image height. Also, in step S306B, a polygon enclosure constraint expression is determined (defined) using a dummy variable (third dummy variable) indicating the upper limit of a wavefront aberration $rms_2$ at a second image height different from the first image height.

In step S308A, it is determined whether the number J of $\beta_{jh}$ serving as a variable is larger than 2 (J>2) for the first image height. If the number J of $\beta_{jh}$ is larger than 2, the process proceeds to step S310A, in which a nested constraint expression serving as a constraint is determined (defined) for the first image height. However, if the number J of $\beta_{jh}$ is equal to or smaller than 2, the process proceeds to step S311A.

Similarly, in step S308B, it is determined whether the number J of $\beta_{jh}$ serving as a variable is larger than 2 (J>2) for the second image height. If the number J of $\beta_{jh}$ is larger than 2, the process proceeds to step S310B, in which a nested constraint expression serving as a constraint is determined (defined) for the second image height. However, if the number J of $\beta_{jh}$ is equal to or smaller than 2, the process proceeds to step S311B.

In step S311A, the upper limit value (third dummy variable $t_{f1}$) of the wavefront aberration $rms_1$ at the first image height is divided by its allowable value $w_1$ to normalize it, as described above. Similarly, in step S311B, the upper limit value (third dummy variable $t_{f2}$) of the wavefront aberration $rms_2$ at the second image height is divided by its allowable value $w_2$ to normalize it. In other words, in steps S311A and S311B, the upper limit value $t_{fh}$ (third dummy variable) of the wavefront aberration $rms_h$ (quadratic optical characteristic value) corresponding to each of a plurality of image heights is divided by the allowable value $w_h$ of the wavefront aberration $rms_1$ to normalize it.

In step S312, the amount of regulation of each object to be regulated (each unit) is obtained (determined) using linear programming, as described above. More specifically, a first dummy variable t (relation (17) indicating the upper limit value (third dummy variable) normalized in steps S311A and S311B is defined as an objective function to obtain the amount of regulation of each object to be regulated, which minimizes the value of the objective function, using linear programming.

With this arrangement, according to this embodiment, the amount of regulation of each object to be regulated can be obtained so as to regulate the quadratic optical characteristic value of the exposure apparatus with good balance for each of a plurality of image heights.

<Third Embodiment>

Figure 9:
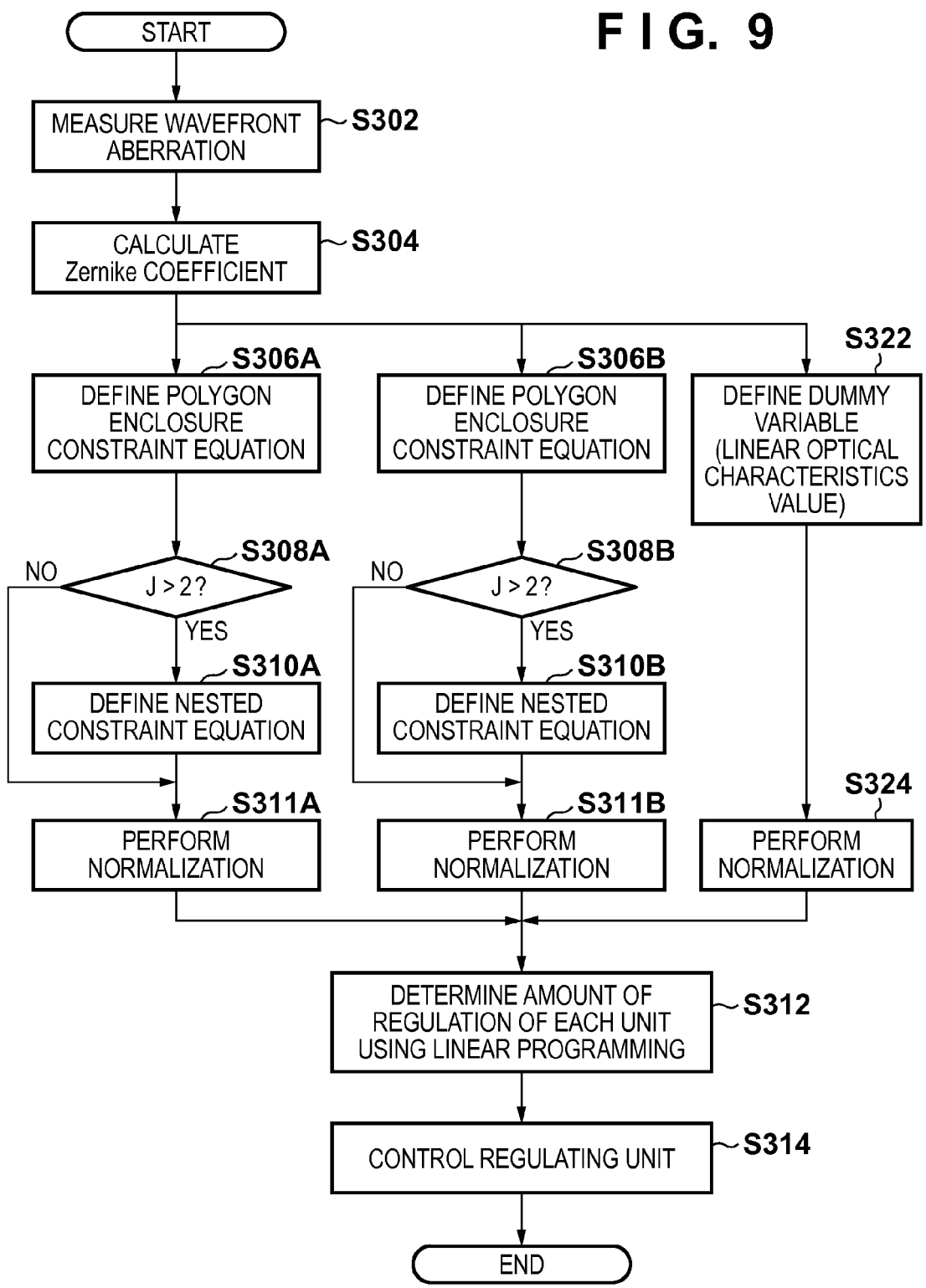
FIG. 9 is a flowchart for explaining how to regulate the projection optical system in the exposure apparatus shown in FIG. 1.

The case wherein not only the quadratic optical characteristic value of an exposure apparatus but also its linear optical characteristic value is regulated will be described in this embodiment. In this case, a first dummy variable indicating the upper limit of the quadratic optical characteristic value need only be used as a variable indicating the upper limit of the linear optical characteristic value as well, as shown in FIG. 9. The linear optical characteristic values of an exposure apparatus (projection optical system 30), such as coma, curvature of field, astigmatism, distortion aberration, and telecentricity, are obtained for each image height. A linear optical characteristic value (the value of the ith aberration at the image height h) $y_{ih}$ is expressed as the linear sum of Zernike coefficients as per:

$$y_{ih} = \sum_{j=1}^{J} a_{ij} z_{jh} \quad (19)$$

where $a_{ij}$ is the degree of influence of the Zernike coefficient $z_{jh}$ on the ith aberration.

To optimize the quadratic and linear optical characteristic values with good balance, the upper limit value of a value (normalized value) obtained by dividing the linear optical characteristic value by its allowable value need only be set as a first dummy variable t in the second embodiment to satisfy:

$$t \geq \frac{1}{Y_i} y_{ih}, \quad (20)$$
$$i = 1, \ldots, I,$$
$$h = 1, \ldots, H$$

where $Y_i$ is the allowable value of the ith aberration.

Then, polygon enclosure constraint expressions corresponding to relations (3) and (13) to (15), and a constraint including relations (17) and (20) are determined. A solution which minimizes the wavefront aberration $rms_h$ with good balance can be obtained for all image heights by solving a linear programming problem represented by an objective function presented in relation (18).

Therefore, referring to FIG. 9, in step S322, an expression for obtaining a linear optical characteristic value is determined (that is, a dummy variable corresponding to a linear optical characteristic value is defined), as described above. In step S324, the linear optical characteristic value determined in step S322 is divided by its allowable value to normalize it.

In step S312, the amount of regulation of each object to be regulated (each unit) is obtained (determined) sing linear programming, as described above. More specifically, a first dummy variable t indicating an upper limit value commonly of the values normalized in steps S311A, S311B, and S324 is defined as an objective function to obtain the amount of regulation of each object to be regulated, which minimizes the value of the objective function, using linear programming.

With this arrangement, according to this embodiment, the amount of regulation of each object to be regulated can be obtained so as to regulate the quadratic and linear optical characteristic values of the exposure apparatus (projection optical system 30) with good balance for each of a plurality of image heights.

<Fourth Embodiment>

A method of manufacturing an article such as a device according to this embodiment can include a step of forming a pattern on an object (for example, a substrate coated with a photoresist) using the above-mentioned exposure apparatus (a step of exposing an object to light). The manufacturing method can also include a step of processing (for example, developing or etching) the object having the pattern formed on it in the forming step. The manufacturing method can moreover include subsequent known steps (for example, oxidation, film formation, vapor deposition, doping, planarization, etching, resist removal, dicing, bonding, and packaging). The method of manufacturing an article according to this embodiment is more advantageous in terms of at least one of the performance, quality, productivity, and manufacturing cost of an article than the conventional method.

Aspects of the present invention can also be realized by a computer of a system or apparatus (or devices such as a CPU or MPU) that reads out and executes a program recorded on a memory device to perform the functions of the above-described embodiments, and by a method, the steps of which are performed by a computer of a system or apparatus by, for example, reading out and executing a program recorded on a memory device to perform the functions of the above-described embodiments. For this purpose, the program is provided to the computer for example via a network or from a recording medium of various types serving as the memory device (for example, computer-readable medium).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-160940 filed on Jul. 19, 2012, which is hereby incorporated by reference herein in its entirety.

The invention claimed is:

1. An exposure apparatus which exposes a substrate to light through a reticle, the apparatus comprising:
   a projection device including an object whose at least one of a position, an attitude and a shape is regulatable, and configured to project light from the reticle onto the substrate;
   a regulating device configured to regulate the at least one of the position, the attitude and the shape of the object; and
   a controller configured to obtain an amount of regulation of the object by the regulating device, the amount of regulation being used for regulating a first optical characteristic value of the projection device expressed by a square root of a weighted square sum of wavefront aberration coefficients of light projected by the projection device, and to control the regulating device based on the amount of regulation,
   wherein the controller is configured, under a constraint including a linear equality and a plurality of linear inequalities, the linear equality being linear with respect to the amount of regulation and indicating the wavefront aberration coefficient, and each of the plurality of linear inequalities being linear with respect to the wavefront aberration coefficient and indicating that, in an orthogonal coordinate system having each coordinate axis that represents the wavefront aberration coefficient, a distance to one of each side and each face of corresponding one of a polygon and a polyhedron, with a center of gravity thereof at an origin of the orthogonal coordinate system, from the origin is not greater than a first variable, to obtain, by linear programming, the amount of regulation which minimizes an objective function, wherein the objective function is the first variable.

2. The apparatus according to claim 1, wherein the constraint further includes a linear inequality indicating that a second optical characteristic value of the projection device, expressed by an expression which is linear with respect to the amount of regulation, is not greater than the first variable.

3. The apparatus according to claim 1, wherein
   the first optical characteristic value is expressed by a square root of a weighted square sum of J (J>2) wavefront aberration coefficients, and
   the plurality of inequalities in the constraint approximately indicate that a square root of a sum of a square of a second variable indicating an upper limit value of a square root of a weighted square sum of the first wavefront aberration to the (J−1)th wavefront aberration coefficient, and a square of the Jth wavefront aberration coefficient is not greater than the first variable.

4. The apparatus according to claim 1, wherein the first variable indicates an upper limit value of a plurality of values each of which is obtained by dividing a third variable, indicating an upper limit value of the first optical characteristic values and given with respect to each of a plurality of points in an image plane of the projection device, by a tolerable value for the third variable.

5. A method for an exposure apparatus which exposes a substrate to light through a reticle, the apparatus including a projection device that includes the object whose at least one of a position, an attitude and a shape is regulatable, and is configured to project light from the reticle onto the substrate, the method obtaining an amount of regulation of the object, the amount of regulation being used for regulating a first optical characteristic value of the projection device expressed by a square root of a weighted square sum of wavefront aberration coefficients of light projected by the projection device, the method comprising:
   under a constraint including a linear equality and a plurality of linear inequalities, the linear equality being linear with respect to the amount of regulation and indicating the wavefront aberration coefficient, and each of the plurality of linear inequalities being linear with respect to the wavefront aberration coefficient and indicating that, in an orthogonal coordinate system having each coordinate axis that represents the wavefront aberration coefficient, a distance to one of each side and each face of corresponding one of a polygon and a polyhedron, with a center of gravity thereof at an origin of the orthogonal coordinate system, from the origin is not greater than a first variable, to obtain, by linear programming, the amount of regulation which minimizes an objective function, wherein the objective function is the first variable.

6. A non-transitory storage medium storing a program that causes a computer to execute a method for an exposure apparatus which exposes a substrate to light through a reticle, the apparatus including a projection device that includes the object whose at least one of a position, an attitude and a shape is regulatable, and is configured to project light from the reticle onto the substrate, the method obtaining an amount of regulation of the object, the amount of regulation being used for regulating a first optical characteristic value of the projection device expressed by a square root of a weighted square sum of wavefront aberration coefficients of light projected by the projection device, the program causing the computer to execute:
   under a constraint including a linear equality and a plurality of linear inequalities, the linear equality being linear with respect to the amount of regulation and indicating the wavefront aberration coefficient, and each of the plurality of linear inequalities being linear with respect to the wavefront aberration coefficient and indicating that, in an orthogonal coordinate system having each coordinate axis that represents the wavefront aberration coefficient, a distance to one of each side and each face of corresponding one of a polygon and a polyhedron, with a center of gravity thereof at an origin of the orthogonal coordinate system, from the origin is not greater than a first variable, to obtain, by linear programming, the amount of regulation which minimizes an objective function, wherein the objective function is the first variable.

7. A method of manufacturing an article, the method comprising:
   exposing a substrate to light using an exposure apparatus;
   developing the exposed substrate; and
   processing the developed substrate to manufacture the article,
   wherein the exposure apparatus exposes the substrate to light through a reticle and includes:
   a projection device including an object whose at least one of a position, an attitude and a shape is regulatable, and configured to project light from the reticle onto the substrate;
   a regulating device configured to regulate the at least one of the position, the attitude and the shape of the object; and
   a controller configured to obtain an amount of regulation of the object by the regulating device, the amount of regulation being used for regulating a first optical characteristic value of the projection device expressed by a square root of a weighted square sum of wavefront aberration coefficients of light projected by the projection device, and to control the regulating device based on the amount of regulation, wherein the controller is configured, under a constraint including a linear equality and a plurality of linear inequalities, the linear equality being linear with respect to the amount of regulation and indicating the wavefront aberration coefficient, and each of the plurality of linear inequalities being linear with respect to the wavefront aberration coefficient and indicating that, in an orthogonal coordinate system having each coordinate axis that represents the wavefront aberration coefficient, a distance to one of each side and each face of corresponding one of a polygon and a polyhedron, with a center of gravity thereof at an origin of the orthogonal coordinate system, from the origin is not greater than a first variable, to obtain, by linear programming, the amount of regulation which minimizes an objective function, wherein the objective function is the first variable.

* * * * *